(12) United States Patent
Binzer et al.

(10) Patent No.: US 9,726,753 B2
(45) Date of Patent: Aug. 8, 2017

(54) CIRCUIT CONFIGURATION FOR RADAR APPLICATIONS

(75) Inventors: Thomas Binzer, Ingersheim (DE); Oliver Brueggmann, Oelbronn-Duerrn (DE); Christian Waldschmidt, Renningen (DE); Dirk Steinbuch, Wimsheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 748 days.

(21) Appl. No.: 14/117,147

(22) PCT Filed: Mar. 13, 2012

(86) PCT No.: PCT/EP2012/054332
§ 371 (c)(1),
(2), (4) Date: Sep. 18, 2014

(87) PCT Pub. No.: WO2012/152474
PCT Pub. Date: Nov. 15, 2012

(65) Prior Publication Data
US 2015/0002330 A1 Jan. 1, 2015

(30) Foreign Application Priority Data
May 10, 2011 (DE) .................. 10 2011 075 552

(51) Int. Cl.
*G01S 7/02* (2006.01)
*G01S 7/03* (2006.01)
(Continued)

(52) U.S. Cl.
CPC .............. *G01S 7/02* (2013.01); *G01S 7/032* (2013.01); *H01L 24/19* (2013.01); *G01S 13/931* (2013.01);
(Continued)

(58) Field of Classification Search
CPC ... G01S 7/02; G01S 7/03; G01S 7/032; G01S 7/40–7/4017; G01S 13/931
(Continued)

(56) References Cited

U.S. PATENT DOCUMENTS 4,490,721 A * 12/1984 Stockton .................. H01Q 3/26
333/116
4,731,614 A * 3/1988 Crane ...................... H01Q 3/42
342/372
(Continued)

FOREIGN PATENT DOCUMENTS

CN 101076740 11/2007
DE 103 00 955 7/2004
(Continued)

*Primary Examiner* — Peter Bythrow
(74) *Attorney, Agent, or Firm* — Norton Rose Fulbright US LLP; Gerard Messina

(57) ABSTRACT

A circuit configuration for radar applications having a printed board and semiconductor modules mounted on it, each of the semiconductor modules including an integrated circuit, a rewiring layer for connecting the integrated circuit to the printed board and at least one antenna element integrated into the semiconductor module and connected to the integrated circuit for transmitting and/or receiving radar signals, the integrated circuit including at least one HF oscillator and a frequency splitter connected to the HF oscillator, the circuit configuration including phase-locked loops for controlling the HF oscillators, each of the phase-locked loops having the frequency splitter and a phase detector for comparing a split-frequency signal of the HF oscillator with a reference signal, and the reference signals may be fed to the phase-locked loops via the printed board.

11 Claims, 3 Drawing Sheets

(51) Int. Cl.
*G01S 13/93* (2006.01)
*H01L 23/00* (2006.01)

(52) U.S. Cl.
CPC ............... *G01S 2013/9321* (2013.01); *H01L 2224/12105* (2013.01); *H01L 2924/181* (2013.01); *H01L 2924/18162* (2013.01)

(58) Field of Classification Search
USPC .............................................. 342/70–72, 175
See application file for complete search history.

(56) References Cited

U.S. PATENT DOCUMENTS

| | | | | |
|---|---|---|---|---|
| 5,376,942 A * | 12/1994 | Shiga | ................ | H01Q 1/247 343/700 MS |
| 5,493,305 A * | 2/1996 | Wooldridge | ....... | H01Q 21/0087 342/368 |
| 6,323,735 B1 * | 11/2001 | Welland | ................ | H01L 24/49 257/531 |
| 6,686,867 B1 * | 2/2004 | Lissel | ................ | G01S 7/032 342/27 |
| 7,049,682 B1 * | 5/2006 | Mathews | ............. | H01L 23/552 257/659 |
| 7,876,261 B1 * | 1/2011 | Adams | ................ | G01S 7/282 342/165 |
| 8,278,749 B2 * | 10/2012 | Lachner | ............. | H01L 23/3135 257/693 |
| 8,456,351 B2 * | 6/2013 | Kam | ....................... | G01S 13/89 342/175 |
| 8,633,851 B2 * | 1/2014 | Vacanti | .................... | G01S 7/03 342/149 |
| 2003/0201930 A1 * | 10/2003 | Nagasaku | ............. | G01S 7/032 342/175 |
| 2005/0156780 A1 * | 7/2005 | Bonthron | .............. | G01S 13/343 342/107 |
| 2005/0225481 A1 * | 10/2005 | Bonthron | ................ | G01S 7/032 342/175 |
| 2005/0285773 A1 * | 12/2005 | Hartzstein | ................ | G01S 7/032 342/70 |
| 2006/0097906 A1 * | 5/2006 | Heide | ..................... | G01S 7/032 342/22 |
| 2006/0262007 A1 * | 11/2006 | Bonthron | ................ | G01S 13/34 342/70 |
| 2008/0117097 A1 * | 5/2008 | Walter | .................... | G01S 7/032 342/175 |
| 2009/0251357 A1 * | 10/2009 | Margomenos | .......... | G01S 7/032 342/70 |
| 2009/0251362 A1 * | 10/2009 | Margomenos | .......... | G01S 7/032 342/175 |
| 2009/0267822 A1 * | 10/2009 | Shinoda | .................. | G01S 7/352 342/70 |
| 2010/0117891 A1 * | 5/2010 | Utagawa | ................... | G01S 7/03 342/175 |
| 2010/0164783 A1 * | 7/2010 | Choudhury | ............. | H01Q 3/26 342/175 |
| 2010/0193935 A1 * | 8/2010 | Lachner | ............... | H01Q 1/2283 257/693 |
| 2011/0285575 A1 * | 11/2011 | Landez | ................... | G01S 7/032 342/70 |
| 2011/0304498 A1 * | 12/2011 | Yanagihara | ............. | G01S 7/412 342/70 |
| 2012/0104574 A1 * | 5/2012 | Boeck | ............... | H01L 23/49816 257/660 |
| 2014/0266866 A1 * | 9/2014 | Swirhun | ................ | G01S 7/026 342/188 |

FOREIGN PATENT DOCUMENTS

| | | |
|---|---|---|
| DE | 10 2004 059332 | 6/2006 |
| DE | 10 2007 051 875 | 5/2009 |
| DE | 10 2010 001407 | 9/2010 |

\* cited by examiner

CIRCUIT CONFIGURATION FOR RADAR APPLICATIONS

FIELD OF THE INVENTION

The present invention relates to a circuit configuration for radar applications, in particular motor vehicle radar applications. The present invention further relates to a radar sensor having such a circuit configuration as well as a motor vehicle radar system having a circuit configuration of this type.

BACKGROUND INFORMATION

Radar sensors are used for measuring the distance and/or speed of objects. In particular, radar systems are known in which speeds and distances of multiple objects are detected simultaneously. For example, vehicle speed regulators are known for motor vehicles having a radar system for locating a preceding vehicle and for measuring the distance to same. Such a distance regulating system is also referred to as an ACC (adaptive cruise control) system.

Radar systems are known which form distributor networks to antenna elements on HF substrates.

German patent document DE 10 2007 051 875 A1 discusses an HF assembly having a printed board unit having a carrier onto which HF chips of HF chip modules are mounted. Multiple antenna devices may be situated centrally on the front side of each HF chip. On both narrow sides of the front side of the HF chip are located two rows of contact surfaces, which are used to conductively connect the HF chip to contacts of the substrate of the HF chip module. Assembly takes place using flip-chip technology. The substrates of the chip modules are in turn connected to terminal areas of the printed board unit.

To simplify the design of HF circuits for radar applications, integrated microwave circuits of the type MMIC (microwave monolithic integrated circuit) are increasingly being used for the transmission and reception circuits.

Wafer assemblies are known in which the assembly is manufactured having a rewiring layer for an IC component at the wafer level. Such a wafer assembly is also referred to as an embedded grid array at the wafer level (eWLB, embedded wafer level ball grid array).

German patent document DE 10 2010 001 407 A1 discusses a semiconductor module in which antennas are integrated at the wafer level. The semiconductor module includes a first housing mold compound layer and an IC component having an integrated circuit that is embedded in the first housing mold compound layer. An intermediate layer includes a rewiring layer, which is connected to the IC component and is used to connect the IC component externally. An integrated antenna structure is situated within the intermediate layer and is connected to the IC component. Such a semiconductor module may be manufactured with a precision suitable for the high-frequency range, for example, 77 GHz.

Such an eWLB semiconductor module having antennas integrated into the housing is also referred to as antenna in package (AiP).

SUMMARY OF THE INVENTION

In a eWLB semiconductor module having an integrated circuit and integrated antennas, for reasons of reliability and manufacturability, the spatial extension of the semiconductor module having an integrated circuit and antennas may not be of arbitrary size. For that reason, only one or a few antenna elements may be accommodated in the eWLB semiconductor module.

For the design of automotive radar sensors having a long range, apertures of the antenna structures are needed, which cannot be implemented within such a semiconductor module due to the limitation of the size of an eWLB semiconductor module.

The object of the present invention is to provide a novel circuit configuration for radar applications which makes it possible to design a radar sensor having a larger aperture.

According to the present invention, this object is achieved by a circuit configuration for radar applications having a printed board and semiconductor modules mounted on it, each of the semiconductor modules having an integrated circuit, a rewiring layer for connecting the integrated circuit to the printed board and at least one antenna element integrated into the semiconductor module and connected to the integrated circuit for transmitting and/or receiving radar signals, the integrated circuit including at least one HF oscillator and a frequency splitter connected to the HF oscillator, the circuit configuration including phase-locked loops for controlling the HF oscillators, each of the phase-locked loops having the frequency splitter and a phase detector for comparing a split-frequency signal of the HF oscillator with a reference signal, and it being possible for the reference signals to be fed to the phase-locked loops via the printed board.

By controlling the HF oscillators of the semiconductor modules via phase-locked loops, the frequency splitter of which is formed in each case in the integrated circuit of the semiconductor module, it is possible to couple, in particular to synchronize, the HF oscillators of the semiconductor modules via reference signals of lower frequency, in particular without the need for an HF signal to be conducted on the printed board. It is thus possible to design the printed board without an HF substrate. This simplifies the design of the circuit configuration considerably, and it is significantly more cost-effective to manufacture. In addition, the integration of the antenna elements into the semiconductor modules results in a particularly efficient and reliable design. It is in particular advantageous that it is possible to couple multiple semiconductor modules having eWLB housings to integrated antennas, it being possible to integrate all high-frequency-conducting components into the particular semiconductor modules.

The HF oscillators are in particular oscillators for generating frequencies in the microwave range, i.e., decimeter, centimeter, and/or millimeter waves.

For example, the phase-locked loops, and, accordingly, the HF oscillators, may be coupled via the reference signals which may be fed to them via the printed board. Apertures, which exceed the extension of a semiconductor module, may be implemented using multiple RF oscillators coupled to particular antenna elements.

For example, coupled reference signals may be provided for the phase-locked loops, in particular reference signals based on a common reference signal. The common reference signal may have a frequency below 1 MHz, which may be below 100 kHz.

The phase-locked loops may be coupled via a common reference signal which may be fed to them via the printed board. The reference signals of the phase-locked loops are thus formed in each case by the common reference signal.

The semiconductor modules may each have a wafer unit and an interface layer, the wafer unit having a semiconductor chip forming the integrated circuit, and having a housing layer in which the semiconductor chip is embedded, and the interface layer having the rewiring layer, which connects the integrated circuit to terminals of the interface layer connected to the printed board. In particular, the semiconductor module may be an eWLB package.

The at least one antenna element may be situated in the interface layer. For example, the antenna element may be manufactured in one method step together with the rewiring layer. The at least one antenna element is, for example, situated in the rewiring layer.

The at least one antenna element may be offset laterally with respect to the semiconductor chip. For example, the at least one antenna element is situated in an area outside of the semiconductor chip in the interface layer laterally offset with respect to the semiconductor chip. The wafer unit and the interface layer, for example, extend in parallel, the interface layer extending across an area of the semiconductor chip and across an area outside of the semiconductor chip.

In one exemplary embodiment, the circuit configuration has an oscillator situated on the printed board for generating a reference signal, in particular a common reference signal. The reference signal may be fed to the phase-locked loops via the printed board. The oscillator may be a crystal oscillator. For example, the oscillator is an oscillator circuit including an oscillating crystal. This makes it possible to achieve a high level of consistency of the reference signal.

In one exemplary embodiment, multiple semiconductor modules are situated in a regular pattern in one row on the printed board. This makes it possible to achieve a locally distributed positioning of the antenna elements integrated into the semiconductor modules.

Exemplary embodiments of the present invention will be elucidated in the following with reference to the drawings.

DETAILED DESCRIPTION

Figure 1:
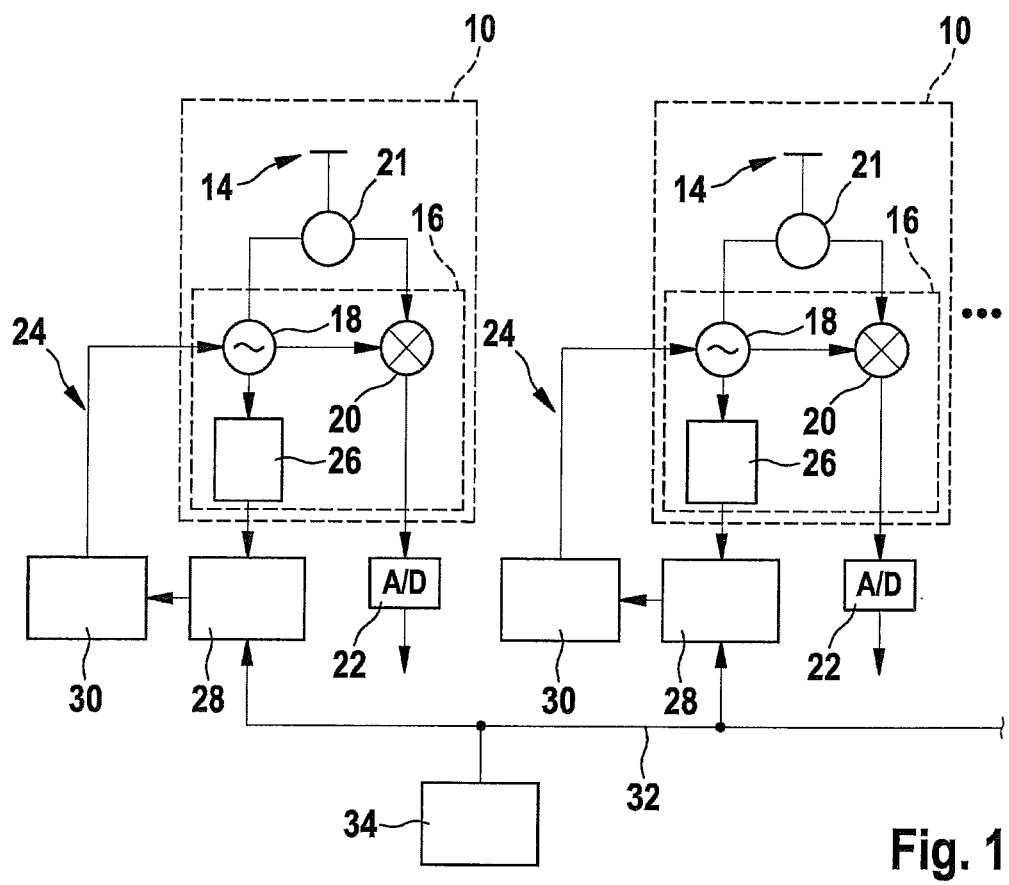
FIG. 1 shows a schematic representation of a circuit configuration of a radar sensor having a monostatic antenna concept.
Figure 2:
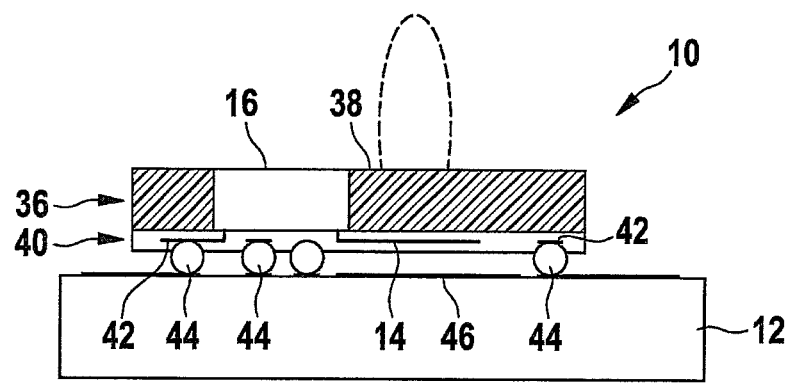
FIG. 2 shows a schematic cross-sectional view of a semiconductor module of the circuit configuration.

FIG. 1 schematically shows a circuit configuration having multiple semiconductor modules 10, one of which is shown in cross section in FIG. 2. Semiconductor modules 10 are, for example, mounted in one row on a printed board 12. In FIG. 1, two of semiconductor modules 10 are shown as examples.

Each of semiconductor modules 10 includes an integrated antenna element 14 and an integrated circuit 16 in the form of a semiconductor chip. The antenna element is, for example, a patch element which is used for transmitting and receiving a radar signal in the example shown. Integrated circuit 16 includes the HF component of a transmission and reception circuit and is connected to antenna element 14.

In particular, integrated circuit 16 includes an HF oscillator 18 for generating a radar signal for emission by antenna element 14. Furthermore, in a known manner, integrated circuit 16 includes a mixer 20 for mixing the received radar signal with the transmitted signal. Antenna element 14 is, for example, connected via a coupler 21 in the form of a rat-race ring to oscillator 18 and mixer 20 in order to separate the transmission and reception signals. The mixed HF signal is, for example, filtered and fed to an A/D converter 22 for further processing. Integrated circuit 16 is a so-called MMIC chip (monolithic microwave integrated circuit).

The frequency and phase position of controllable HF oscillator 18 is regulated using a phase-locked loop 24 which includes a frequency splitter 26, a phase discriminator or phase detector 28 and a loop filter or regulating filter 30. For example, HF oscillator 18 is a voltage-controlled oscillator (VCO). Via a conductor structure 32 on printed board 12, a common reference signal from an oscillator 34 is fed to phase detectors 28 of the particular phase control circuits. Oscillator 34 is a crystal oscillator that includes an oscillating crystal. Phase-locked loops 24 are coupled together by the common reference signal. In the example described, they are synchronized in particular, so that HF oscillators 18 oscillate synchronously. Particular phase detector 28 compares the signal of the HF oscillator which is divided down by frequency splitter 26 using the reference signal supplied via conductor structure 32. Regulating filter 30 converts the output signal of phase detector 28 into a control signal for controllable HF oscillator 18.

As an option, except for the rat-race ring of coupler 21, integrated circuit 16 includes all the HF-conducting components assigned to particular antenna element 14. In particular, in addition to HF oscillator 18, integrated circuit 16 also includes frequency splitter 26 and mixer 20. As described below, particular antenna elements 14 and coupler 21 are integrated into semiconductor modules 10. Thus, all high-frequency processing circuit components of the circuit configuration, including the high-frequency processing circuit components of the phase-locked loops, may be integrated into semiconductor modules 10. Printed board 12 may therefore be an ordinary printed board without an HF substrate. This is made possible since, on the one hand, only a low-frequency signal is required for coupling the phase-locked loops, and since on the other hand both the antenna elements and the HF-conducting circuit components, including frequency splitter 26, are integrated into the particular semiconductor modules.

FIG. 2 schematically shows the design of one of semiconductor modules 10.

Semiconductor module 10 is a so-called eWLB package, in which a wafer unit includes the semiconductor chip which forms integrated circuit 16 and a housing mold compound layer which forms a housing layer 38, into which the semiconductor chip is embedded. This wafer unit 36, which is assembled during manufacturing, is also referred to as a reconstituted wafer. It is provided with an interface layer 40 which has a rewiring layer 42 and terminals 44 in the form of 3D connecting structures, in particular solder balls. The rewiring layer has contact points on a first side, which contact the contact points of wafer unit 36. On a second side, the rewiring layer is connected to terminals 44 for external contacting. In this way, integrated circuit 16 is connected to terminals 44 of interface layer 40 which are connected to printed board 12. FIG. 2 shows as an example four terminals 44 which are connected to printed conductor tracks on printed board 12. Semiconductor module 10 may be mounted onto printed board 12 using standard processes, in particular surface mount processes.

In addition, antenna element 14 is integrated into interface layer 40, and connected to integrated circuit 16 via coupler 21 which is also integrated into the interface layer. In particular, antenna element 14 and coupler 21 as a part of rewiring layer 42 are integrated into the interface layer. Diverging, however, from the representation shown in FIG. 1, coupler 21 may also be integrated into the semiconductor chip of integrated circuit 16, and integrated circuit 16 may include coupler 21.

Antenna element 14 is laterally offset with respect to the semiconductor chip and thus lies in the area adjacent to housing layer 38, outside of an area of interface layer 40 which is adjacent to the semiconductor chip. A main emission direction of antenna element 14 perpendicular to wafer unit 36 is shown in FIG. 2 as a dashed line. On the opposite side, printed board 12 is provided with a reflector 46 in the form of a conductive area. Antenna element 14 is connected via coupler 21 to the semiconductor chip via contact points on the first side of rewiring layer 42. The integration of antenna element 14 into the semiconductor module manufactured at the wafer level with antenna in the housing (antenna in package, AiP) makes a precise connection of the antenna element possible, so that particularly efficient manufacturing is made possible. In particular in contrast to conventional antenna patches, which are to be connected to an HF circuit externally, the need for an HF substrate on the printed board is eliminated. Nonetheless, the described coupled phase-locked loops of HF oscillators 18 make it possible to achieve a defined phase relationship of the radar signals emitted by antenna elements 14.

This circuit configuration makes it possible to implement a radar front end of a radar sensor without an HF substrate, since only the low-frequency portion of the phase-locked loop is located along with the other circuit elements on printed board 12, while the high-frequency circuit components are integrated into semiconductor modules 10.

Figure 3:
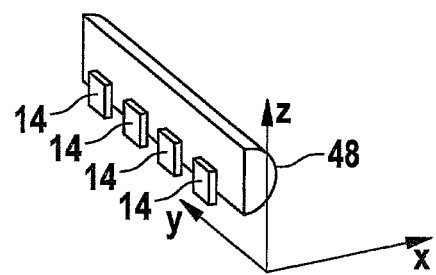
FIG. 3 shows a schematic representation of the design of a radar sensor of a motor vehicle radar system having antenna elements situated in series and a dielectric lens.

FIG. 3 schematically shows a radar sensor having a one-row arrangement of antenna elements 14 of the circuit configuration from FIG. 1. Antenna elements 14 are situated in front of a beam forming device 48 in the form of a dielectric cylindrical lens having a circular-segment-shaped cross section. Antenna elements 14 are situated side by side in the transverse direction (Y-direction) and have a main emission direction in the direction of the lens (the X direction). The lens causes a bundling or focusing of the radar signal in the vertical direction (Z-direction), i.e., relating to the elevation.

In a manner known per se, the beam forming device may contain other dielectric elements or lenses, for example, for azimuthal focusing of the radar signal in the Y direction.

Figure 4:
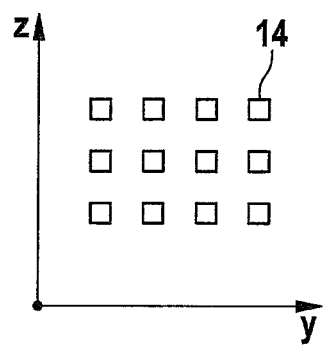
FIG. 4 shows a schematic representation of a matrix system of antenna elements.

FIG. 4 shows a variant in which the semiconductor modules and hence antenna elements 14 form a matrix system on printed board 12. Antenna elements 14 are situated at regular intervals in rows and columns in the Y direction and the Z direction.

In the exemplary embodiments of FIGS. 3 and 4, the above-described circuit configuration makes it possible to synchronize the phase position of antenna elements 14 in relation to one another, so that in a manner known per se, inferences may be drawn concerning the direction of an object reflecting the radar signal, for example, from the phase position of the received signals.

Figure 5:
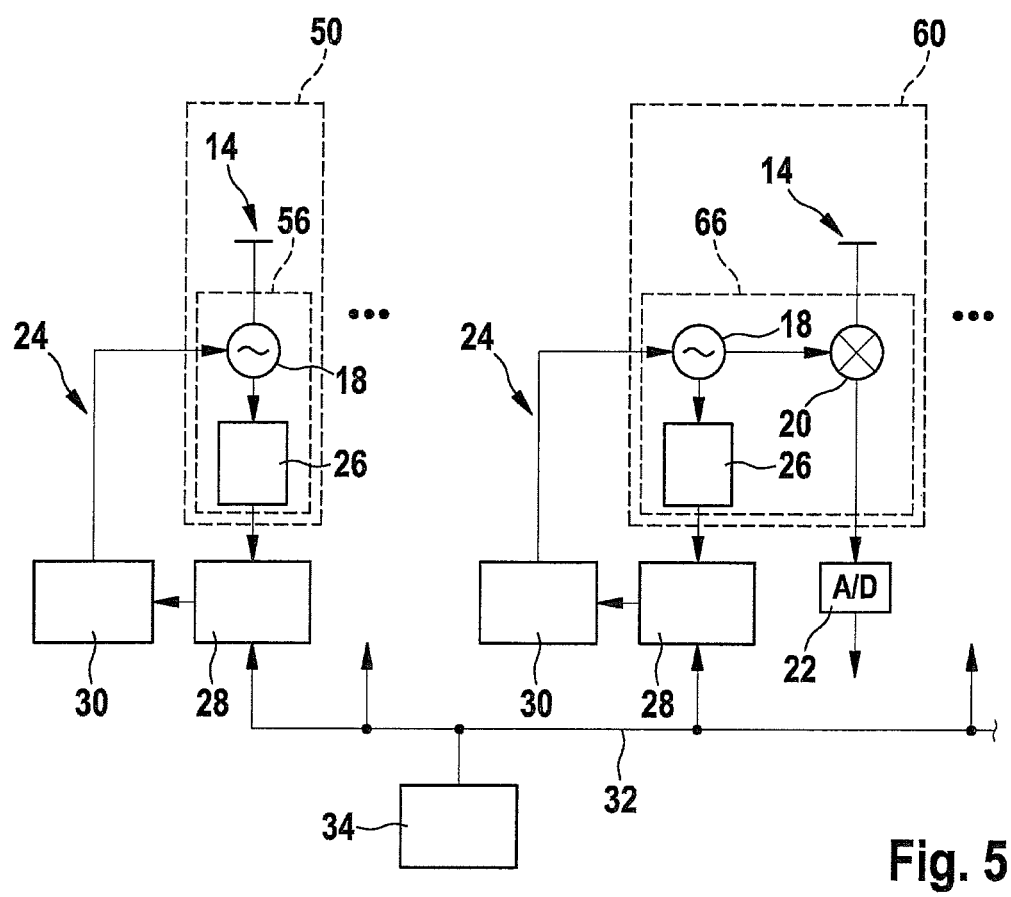
FIG. 5 shows a schematic view of one specific embodiment of a circuit configuration having a bistatic antenna concept.

While FIG. 1 shows a monostatic circuit configuration in which antenna elements 14 each act as a transmitting antenna and as a receiving antenna, FIG. 5 shows an example of a bistatic circuit configuration in which separate semiconductor modules 50 having transmitting antenna elements 14 and semiconductor modules 60 having receiving antenna elements 14 are provided, in each case without a coupler 21. In other respects, the circuit configuration corresponds to the circuit configuration described with reference to FIG. 1, and semiconductor modules 50, 60 are configured similarly to circuit modules 10. In this case, for example, mixer 20 is provided only in receiving semiconductor module 60. For example, multiple transmitting semiconductor modules 50 are situated in one row, and multiple receiving semiconductor modules 60 are situated in parallel to them in one row. In turn, all high-frequency-carrying components are integrated together with antenna elements 14 into semiconductor modules 50, 60. In this case, transmitting semiconductor modules 50 each include an antenna element 14 and an integrated circuit 56 in the form of a semiconductor chip, which includes HF oscillator 18 and frequency splitter 26. Receiving semiconductor modules 60 each include an antenna element 14 and an integrated circuit 66 in the form of a semiconductor chip, which includes HF oscillator 18, frequency splitter 26 and mixer 20.

The radar sensor having one of the above-described circuit configurations is, for example, a component of a motor vehicle radar system, in particular of a motor vehicle radar system for driver assistance.

In the examples described, a common reference signal is fed to phase-locked loops 24 via conductor structure 32, the common reference signal being used directly for activating frequency splitter 28 in order to synchronize HF oscillators 18 with one another. Divergent from this, other forms of coupling the HF oscillators using reference signals supplied via printed board 12 are conceivable. A coupling, in particular a defined phase relationship between HF oscillators 18 in the same or different oscillation frequencies, may be caused, for example, by supplying the common reference signal to phase detector 28 via a frequency splitter and/or a mixer. In this way, reference signals provided with a frequency offset may be fed to the individual phase-locked loops. In this connection, the reference signals are based on the common reference signal. It is also conceivable to provide multiple coupled oscillators 34 for supplying the particular phase-locked loops via appropriate conductor structures 32.

In the examples described, the antenna elements are patch elements. However, it is also possible to provide antenna elements in the form of electric dipoles, for example, printed dipoles, or magnetic dipoles.

What is claimed:

1. A circuit configuration for a radar application, comprising:
   a printed board;
   semiconductor modules mounted on the printed board, each of the semiconductor modules including an integrated circuit, a rewiring layer for connecting the integrated circuit to the printed board and at least one antenna element integrated into the semiconductor module and connected to the integrated circuit for at least one of transmitting and receiving radar signals, and wherein integrated circuits of the semiconductor modules each include at least one HF oscillator and a frequency splitter connected to the HF oscillator; and
   phase-locked loops for controlling the at least one HF oscillator, each of the phase-locked loops having the frequency splitter and a phase detector for comparing a split-frequency signal of the HF oscillator with a reference signal, wherein the reference signals are feedable to the phase-locked loops via the printed board, and wherein the phase detector is external to the semiconductor module, wherein at least one integrated circuit of the semiconductor modules consists of exactly one HF oscillator and exactly one frequency splitter.

2. The circuit configuration of claim 1, wherein the semiconductor modules each have a wafer unit and an interface layer, the wafer unit having a semiconductor chip, which forms the integrated circuit, and a housing layer, in which the semiconductor chip is embedded, and the interface layer having the rewiring layer which connects the integrated circuit to terminals of the interface layer connected to the printed board.

3. The circuit configuration of claim 2, wherein the at least one antenna element is situated in the interface layer.

4. The circuit configuration of claim 1, further comprising:
an oscillator situated on the printed board for generating a reference signal.

5. The circuit configuration of claim 4, wherein the reference signal is a common reference signal for the phase-locked loops.

6. The circuit configuration of claim 1, wherein multiple semiconductor modules are situated in a regular pattern in one row on the printed board.

7. The circuit configuration of claim 1, wherein a beam forming device is situated in front of the semiconductor modules on a side of the semiconductor modules facing away from the printed board.

8. The circuit configuration of claim 1, wherein the semiconductor modules are situated at regular intervals in rows and columns on the printed board.

9. A radar sensor, comprising:
a circuit configuration for a radar application, including:
a printed board;
semiconductor modules mounted on the printed board, each of the semiconductor modules including an integrated circuit, a rewiring layer for connecting the integrated circuit to the printed board and at least one antenna element integrated into the semiconductor module and connected to the integrated circuit for at least one of transmitting and receiving radar signals, and wherein integrated circuits of the semiconductor modules each include at least one HF oscillator and a frequency splitter connected to the HF oscillator; and
phase-locked loops for controlling the at least one HF oscillator, each of the phase-locked loops having the frequency splitter and a phase detector for comparing a split-frequency signal of the HF oscillator with a reference signal, wherein the reference signals are feedable to the phase-locked loops via the printed board, and wherein the phase detector is external to the semiconductor module, wherein at least one integrated circuit of the semiconductor modules consists of exactly one HF oscillator and exactly one frequency splitter.

10. A motor vehicle radar system, comprising:
a circuit configuration for a radar application, including:
a printed board;
semiconductor modules mounted on the printed board, each of the semiconductor modules including an integrated circuit, a rewiring layer for connecting the integrated circuit to the printed board and at least one antenna element integrated into the semiconductor module and connected to the integrated circuit for at least one of transmitting and receiving radar signals, and wherein integrated circuits of the semiconductor modules each include at least one HF oscillator and a frequency splitter connected to the HF oscillator; and
phase-locked loops for controlling the at least one HF oscillator, each of the phase-locked loops having the frequency splitter and a phase detector for comparing a split-frequency signal of the HF oscillator with a reference signal, wherein the reference signals are feedable to the phase-locked loops via the printed board, and wherein the phase detector is external to the semiconductor module wherein at least one integrated circuit of the semiconductor modules consists of exactly one HF oscillator and exactly one frequency splitter.

11. The circuit configuration of claim 1, wherein at least one other integrated circuit of the semiconductor modules consists of exactly one other HF oscillator, exactly one other frequency splitter, and a mixer.

* * * * *